United States Patent [19]

Sumi et al.

[11] 4,431,970
[45] Feb. 14, 1984

[54] QUADRATURE DETECTOR USING A DOUBLE BALANCED DIFFERENTIAL CIRCUIT AND A CONSTANT CURRENT CIRCUIT

[75] Inventors: Tatsumi Sumi, Hirakata; Shiro Mizutani, Kyoto; Yukihiko Miyamoto, Tama; Atsushi Ogawa, Yokohama, all of Japan

[73] Assignees: Matsushita Electric Industrial Co., Ltd., Osaka; Trio Kabushiki Kaisha, Tokyo, both of Japan

[21] Appl. No.: 283,790

[22] Filed: Jul. 15, 1981

[30] Foreign Application Priority Data

Aug. 27, 1980 [JP] Japan .................. 55-118789

[51] Int. Cl.³ .............................................. H03D 3/14
[52] U.S. Cl. .................... 329/103; 329/137; 455/214
[58] Field of Search ............... 329/101, 103, 137, 138; 455/214, 337; 330/288; 307/296 R

[56] References Cited

U.S. PATENT DOCUMENTS 4,362,998  12/1982  Watanabe et al. .................. 329/103

FOREIGN PATENT DOCUMENTS 54-128257  10/1979  Japan .................................... 329/103

Primary Examiner—Siegfried H. Grimm
Attorney, Agent, or Firm—Stevens, Davis, Miller & Mosher

[57] ABSTRACT

A quadrature detector comprising a double balanced differential circuit including a constant current circuit, and a phase shifter circuit. The constant current circuit comprises a plurality of transistors having their collectors connected together, their bases connected together and their emitters connected to a reference potential level through respective resistors. By the arrangement of the constant current circuit, a current density in the transistors is reduced, a noise generated by the constant current circuit is reduced and hence the S/N ratio of the quadrature detector is improved.

7 Claims, 2 Drawing Figures

QUADRATURE DETECTOR USING A DOUBLE BALANCED DIFFERENTIAL CIRCUIT AND A CONSTANT CURRENT CIRCUIT

The present invention relates to a quadrature detector having a double balanced differential circuit with a constant current circuit comprising a plurality of transistors.

It is an object of the present invention to provide a quadrature detector having an improved signal to noise ratio (S/N).

As shown in FIG. 1, a prior art quadrature detector comprises a phase shifter circuit 1 for phase-shifting an FM signal applied to input terminals $i_1$ and $i_2$ by substantially 90 degrees at its center frequency and a multiplier circuit 2 for multiplying the original signal with the 90-degree phase-shifted signal. The multiplier circuit 2 is fabricated in the form of a double balanced differential circuit comprising three differential circuits composed of transistor pairs $Q_1$, $Q_2$ and $Q_3$, $Q_4$ acting, as known, as a phase detector and $Q_5$, $Q_6$, respectively, and a constant current circuit composed of a transistor $Q_7$.

Noise sources of the prior art quadrature detector are the three differential circuits and the constant current circuit of the double balanced differential circuit 2. The differential circuit primarily generates a phase noise, which can be suppressed by supplying a sufficiently high level signal. The phase noise can be further suppressed by applying a current feedback to the differential circuit by inserting resistors of small resistance to emitters of the transistors forming the differential circuit.

Accordingly, in the quadrature detector having the double balanced differential circuit 2 whose phase noise is suppressed in the manner described above, the noise generated by the constant current circuit occupies a large portion of the output signal. It is therefore necessary to suppress the noise generated by the constant current circuit in order to improve the S/N of the quadrature detector. The noise generated by the constant current circuit is an amplitude noise. Heretofore, the amplitude noise has been suppressed by reducing the voltage gain of the transistor $Q_7$ to the noise, and it has been realized by reducing a current density in an emitter of the transistor $Q_7$ or increasing a resistance $R_E$ of a resistor $R_7$ inserted between the emitter and ground.

However, since the increase of the resistance $R_E$ results in the decrease of an output current of the constant current circuit, this approach has a limitation.

The present invention, therefore, intends to overcome the above difficulties and it is characterized by improving the S/N by decreasing the current density in the transistors of the constant current circuit without reducing the output current of the circuit, and preventing the noise generated by the transistors from appearing across the load resistor.

Further objects, features and advantages of the invention are described with reference to the following accompanying drawings, in which.

Figure 1:
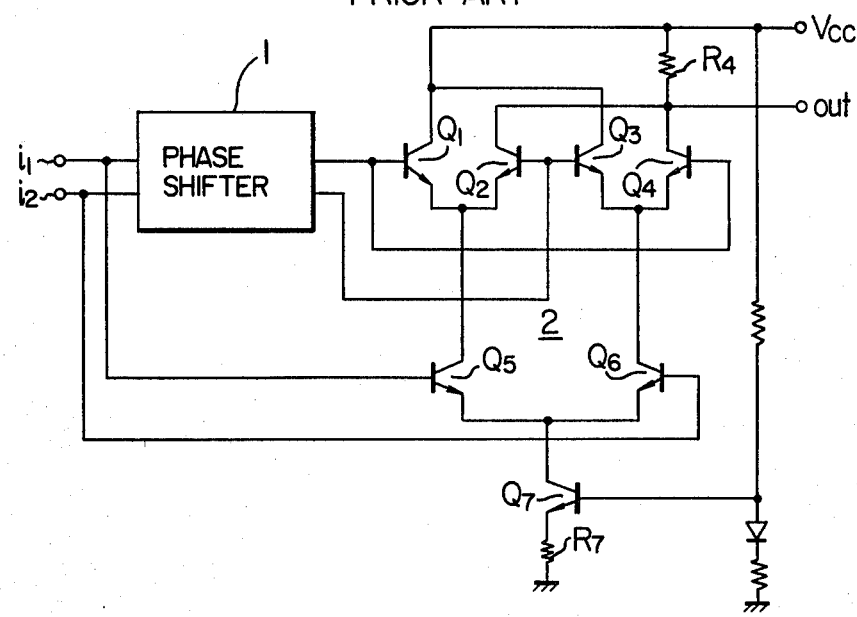
FIG. 1 shows a circuit diagram of a prior art quadrature detector.
Figure 2:
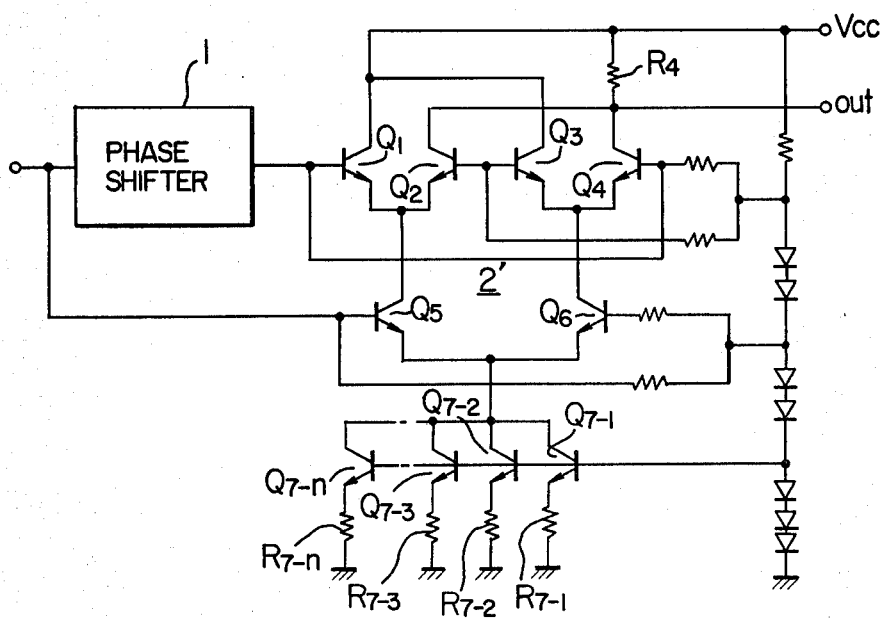
FIG. 2 shows a circuit diagram of a quadrature detector in accordance with one embodiment of the present invention.

In FIG. 2, the like elements to those shown in the prior art quadrature detector of FIG. 1 are designated by the like numerals, numeral 1 denotes a phase shifter circuit for phase-shifting an FM signal applied to its input terminal by substantially 90 degrees at its center frequency and numeral 2' denotes a double balanced differential circuit forming a multiplier, the resulting phase-shifted signal being applied to base of transistors $Q_1$ and $Q_4$ of the differential circuit 2' and the original FM signal being applied to base of the transistor $Q_5$. A constant current circuit of the double balanced differential circuit 2' comprises n transistors $Q_{7\text{-}1}$, $Q_{7\text{-}2}$, ... $Q_{7\text{-}n}$ and resistors $R_{7\text{-}1}$, $R_{7\text{-}2}$, ... $R_{7\text{-}n}$ inserted between emitters of the transistors $Q_{7\text{-}1}$, $Q_{7\text{-}2}$, ... $Q_{7\text{-}n}$ and ground, respectively. Collectors and bases of the transistors $Q_{7\text{-}1}$, $Q_{7\text{-}2}$, ... $Q_{7\text{-}n}$ are connected together, respectively. Each combination of the transistors and the resistors works as a constant current source.

A noise output $V_o$ is represented by $V_o = V_n \cdot R_C / R_E$, where $R_C$ is a resistance of the load resistor $R_4$ and $V_n$ is a noise generated by the transistor of the constant current circuit. If the magnitude of resistance $R_E$ is increased by a factor of n, the noise output $V_o$ is reduced by a factor of n. An output current of the constant current circuit also reduces by a factor of n. But a total output current does not decrease if n number of such constant current sources are provided in parallel connection. In this case, a noise voltage generated by each of the transistors of the constant current sources across the load resistor $R_4$ is expressed by $$V_n \times \frac{R_C}{nR_E}.$$

Since a noise power across the load resistor $R_4$ is a sum of noise power generated by the respective transistors, the noise power $W_n$ by the constant current sources across the load resistor $R_4$ is expressed by $$W_n = \left\{ \left( V_n \times \frac{R_C}{nR_E} \right)^2 / R_C \right\} \times n = \frac{V_n^2}{R_E^2} \times \frac{R_C}{n}.$$

Accordingly, a noise output voltage $V_o'$ is expressed by $$V_o' = \sqrt{W_n \times R_C} = V_n \times \frac{R_C}{R_E} \times \frac{1}{\sqrt{n}}.$$

Consequently, $$V_o' = V_o / \sqrt{n}.$$

Accordingly, in the present embodiment shown in FIG. 2, by selecting the resistances of the resistors $R_{7\text{-}1}$, $R_{7\text{-}2}$, ... $R_{7\text{-}n}$ to be n times as large as the resistance of the resistor $R_7$ shown in FIG. 1, the noise output voltage of the double balanced differential circuit 2' having the n parallel-connected constant current sources is reduced by a factor of $\sqrt{n}$.

In addition, the current density in the transistors $Q_{7\text{-}1}$, $Q_{7\text{-}2}$, ... $Q_{7\text{-}n}$ is also reduced by a factor of n without reducing the output current of the constant current circuit and hence the noises generated in the transistors $Q_{7\text{-}1}$, $Q_{7\text{-}2}$, ... $Q_{7\text{-}n}$ are also reduced.

As described hereinabove, according to the quadrature detector of the present invention, the constant current circuit of the double balanced differential circuit comprises a plurality of transistors having resistors connected between a reference potential level and respective emitters, with collectors and bases being connected together, respectively and an output current of the constant current is taken from the common junction node of the collectors. As a result, the noise generated by the constant current circuit is reduced and the S/N of the quadrature detector is improved.

What is claimed is:

1. A quadrature detector using a double balanced differential circuit and a constant current circuit comprising:

a phase shifter circuit which shifts an applied FM signal according to its frequency and a double balanced differential circuit which receives said applied signal and a phase shifted FM signal through said phase shifter circuit for detecting said applied FM signal, said double balanced differential circuit including a phase detector, a differential circuit comprised of two transistors and a constant current source;

emitters of said two transistors being connected together forming a common emitter junction, collector outputs of said two transistors being applied to said phase detector, at least one of said two transistors having its base driven by said applied FM signal, said constant current circuit comprising a plurality of transistors whose bases are connected together and biased by a voltage source, whose emitters are connected to a reference potential through respective resistors, and whose collectors are connected to said common emitter junction.

2. A quadrature detector comprising:

means for applying at least one FM signal, a phase shifter circuit for shifting an applied FM signal to produce a signal which is phase shifted by an amount depending on the frequency of the FM signal, a multiplier for receiving the applied FM signal and the phase shifted FM signal and producing an FM detected output signal, and a constant current circuit, said multiplier including a phase detector connected to said constant current circuit through a differential circuit comprising transistors;

emitters of said transistors being connected together forming a common emitter junction, collector outputs of said transistors being applied to said phase detector, at least one of said transistors having its base controlled by the applied FM signal, said phase detector being controlled by said phase shifted signal, said constant current circuit comprising a plurality of transistors having respective bases connected together and biased by a predetermined voltage source, respective emitters connected to a reference potential level through respective resistors and collectors commonly connected to said common emitter junction.

3. A quadrature detector according to claim 2, wherein said reference potential level is gound level.

4. A quadrature detector according to claim 2, wherein resistances of said resistors are equal to each other.

5. A quadrature detector comprising:

means for applying an FM signal;

a phase shifter circuit for phase-shifting the applied FM signal in response to its frequency and producing a phase shifted signal;

a multiplier and a constant current circuit, said multiplier including a phase detector comprising first and second differential circuits having respective control terminals, and a third differential circuit comprising first and second transistors having emitters connected together to form a common emitter junction and connected to an output terminal of said constant current circuit, said first and second differential circuits being connected respectively through said first and second transistors to said output terminal of said constant current circuit;

means for applying said FM signal to a base of one of said first and second transistors;

means for applying the phase shifted signal to one control terminal of each of said first and second differential circuits, whereby said multiplier multiplies the applied FM signal and phase shifted signal to produce an FM detected output signal; and wherein said constant current circuit comprises a plurality of resistors and a plurality of transistors having bases which are connected together and biased by a predetermined voltage source, the collectors of said plurality of transistors being connected to said common emitter junction, and the emitters of said plurality of transistors being connected to a reference potential level through said resistors respectively.

6. A quadrature detector comprising:

means for applying an FM signal;

a phase shifter circuit for producing a phase shifted signal by phase-shifting the applied FM signal in response to its frequency;

a constant current circuit;

a double balanced differential circuit including first, second and third differential amplifiers each comprising transistors connected as a differential pair, said third differential amplifier transistors having emitters connected together forming a common emitter junction and collectors respectively connected to emitters of said first and second differential amplifier transistors, means for applying said FM signal to at least a base of one of the transistors of said third differential amplifier, and means for applying the phase shifted signal to a base of at least one of the transistors of each of said first and second differential amplifiers, whereby said double balanced differential circuit multiplies the applied FM signal and phase shifted signal to produce an FM detected output signal; and wherein said constant current circuit comprises a plurality of resistors, and a plurality of transistors having bases connected together and biased by a predetermined voltage source, collectors of said plurality of transistors being connected to said common emitter junction, and emitters of said plurality of transistors being connected to a reference potential level through said resistors respectively.

7. A quadrature detector according to claim 6, wherein said first differential amplifier comprises first and second transistors, said second differential amplifiers comprises third and fourth transistors, said third differential amplifier comprises fifth and sixth transistors, said second and third transistors have bases connected in common, said first and second transistors have emitters commonly connected to a collector of said sixth transistor, the bases of said second and third transistors being fixedly biased from a first bias source, and a base of said sixth transistor being fixedly biased from a second bias source; said FM signal is applied to a base of said fifth transistor, and said phase shifted signal being applied to a base of said first and fourth transistors.

* * * * *